(12) United States Patent
Huang et al.

(10) Patent No.: US 9,275,994 B2
(45) Date of Patent: *Mar. 1, 2016

(54) INTEGRATED CIRCUITS HAVING DUMMY GATE ELECTRODES AND METHODS OF FORMING THE SAME

(71) Applicant: TAIWAN SEMICONDUCTOR MANUFACTURING COMPANY, LTD., Hsinchu (TW)

(72) Inventors: Mei-Hui Huang, Cupertino, CA (US); Chan-Hong Chern, Palo Alto, CA (US)

(73) Assignee: TAIWAN SEMICONDUCTOR MANUFACTURING COMPANY, LTD. (TW)

( * ) Notice: Subject to any disclaimer, the term of this patent is extended or adjusted under 35 U.S.C. 154(b) by 0 days.

This patent is subject to a terminal disclaimer.

(21) Appl. No.: 14/546,818

(22) Filed: Nov. 18, 2014

(65) Prior Publication Data

US 2015/0069530 A1   Mar. 12, 2015

Related U.S. Application Data

(63) Continuation of application No. 14/245,239, filed on Apr. 4, 2014, now Pat. No. 8,928,088, which is a continuation of application No. 13/710,012, filed on Dec. 10, 2012, now Pat. No. 8,723,273, which is a continuation of application No. 12/795,144, filed on Jun. 7, 2010, now Pat. No. 8,350,339.

(51) Int. Cl.
| | |
|---|---|
| *H01L 27/088* | (2006.01) |
| *H01L 29/06* | (2006.01) |
| *H01L 21/8234* | (2006.01) |
| *H01L 27/02* | (2006.01) |
| *H01L 29/423* | (2006.01) |
| *H01L 29/66* | (2006.01) |

(52) U.S. Cl.
CPC ...... *H01L 27/088* (2013.01); *H01L 21/823425* (2013.01); *H01L 21/823437* (2013.01); *H01L 27/0207* (2013.01); *H01L 29/0619* (2013.01); *H01L 29/0649* (2013.01); *H01L 29/42372* (2013.01); *H01L 29/66545* (2013.01)

(58) Field of Classification Search
CPC . H01L 27/088; H01L 27/0207; H01L 27/092; H01L 21/761; H01L 21/823425; H01L 21/823437; H01L 29/0619; H01L 29/0649; H01L 29/42372; H01L 29/66545; H01L 29/861

See application file for complete search history.

(56) References Cited

U.S. PATENT DOCUMENTS

2009/0152649 A1   6/2009   Kim

*Primary Examiner* — Whitney T Moore
(74) *Attorney, Agent, or Firm* — Hauptman Ham, LLP

(57) ABSTRACT

An integrated circuit comprises a gate electrode of at least one active transistor. The integrated circuit also comprises a first dummy gate electrode on a first side of the gate electrode. The integrated circuit further comprises a second dummy gate electrode on a second side of the gate electrode, the second side being opposite the first side. The integrated circuit additionally comprises a diffusion ring surrounding the gate electrode, the first dummy gate electrode, and the second dummy gate electrode. The integrated circuit also comprises a diffusion area extending from a first edge of the diffusion ring to a second edge of the diffusion ring.

20 Claims, 9 Drawing Sheets

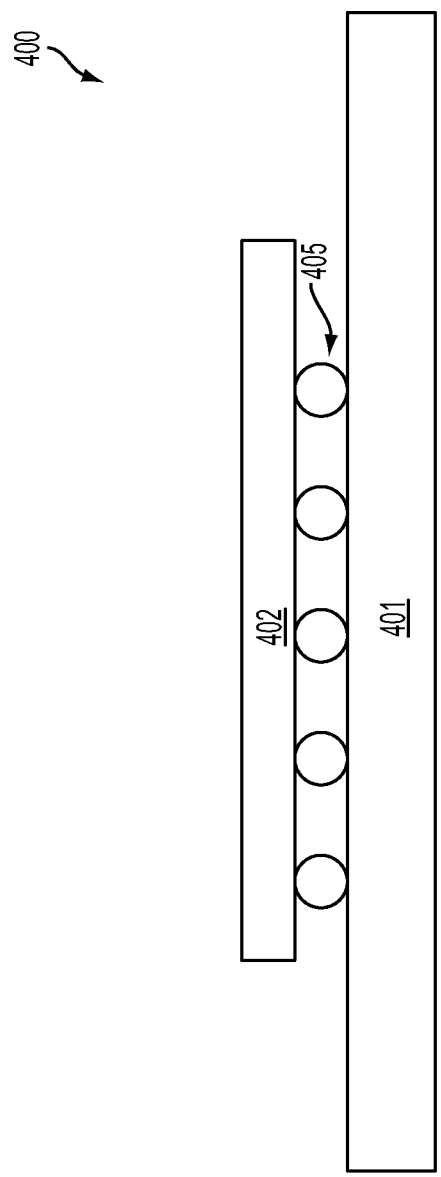

INTEGRATED CIRCUITS HAVING DUMMY GATE ELECTRODES AND METHODS OF FORMING THE SAME

PRIORITY CLAIM

The present application is a continuation of U.S. application Ser. No. 14/245,239, filed Apr. 4, 2014, which is a continuation of U.S. application Ser. No. 13/710,012, filed Dec. 10, 2012, which is a continuation U.S. application Ser. No. 12/795,144, filed Jun. 7, 2010, which is incorporated by reference herein in their entireties.

TECHNICAL FIELD

The present application relates generally to the field of semiconductor devices, and more particularly, to integrated circuits having dummy gate electrodes and methods of forming the integrated circuits.

BACKGROUND

The semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed.

In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling-down also produces a relatively high power dissipation value, which may be addressed by using low power dissipation devices such as complementary metal-oxide-semiconductor (CMOS) devices.

A substantial number of layout dependent effects (LDE) rapidly occur along with the scaling of CMOS devices due to smaller geometries and increasing number of strain engineering methods for improving transistor performances. Many layout practices are being taken in the industry to mitigate the layout dependent effects, preserve transistor matching, and provide more consistent transistor performances with respect to SPICE modeling. However, the methods known to the inventors for mitigating layout dependent effects incur an increase in layout area.

BRIEF DESCRIPTION OF THE DRAWINGS

The present disclosure is best understood from the following detailed description when read with the accompanying figures. It is emphasized that various features are not drawn to scale and are used for illustration purposes only. In fact, the dimensions of the various features may be arbitrarily increased or reduced for clarity of discussion.

FIG. 4 is a schematic drawing illustrating a system including an exemplary integrated circuit disposed over a substrate board.

DETAILED DESCRIPTION

Figure 1A:
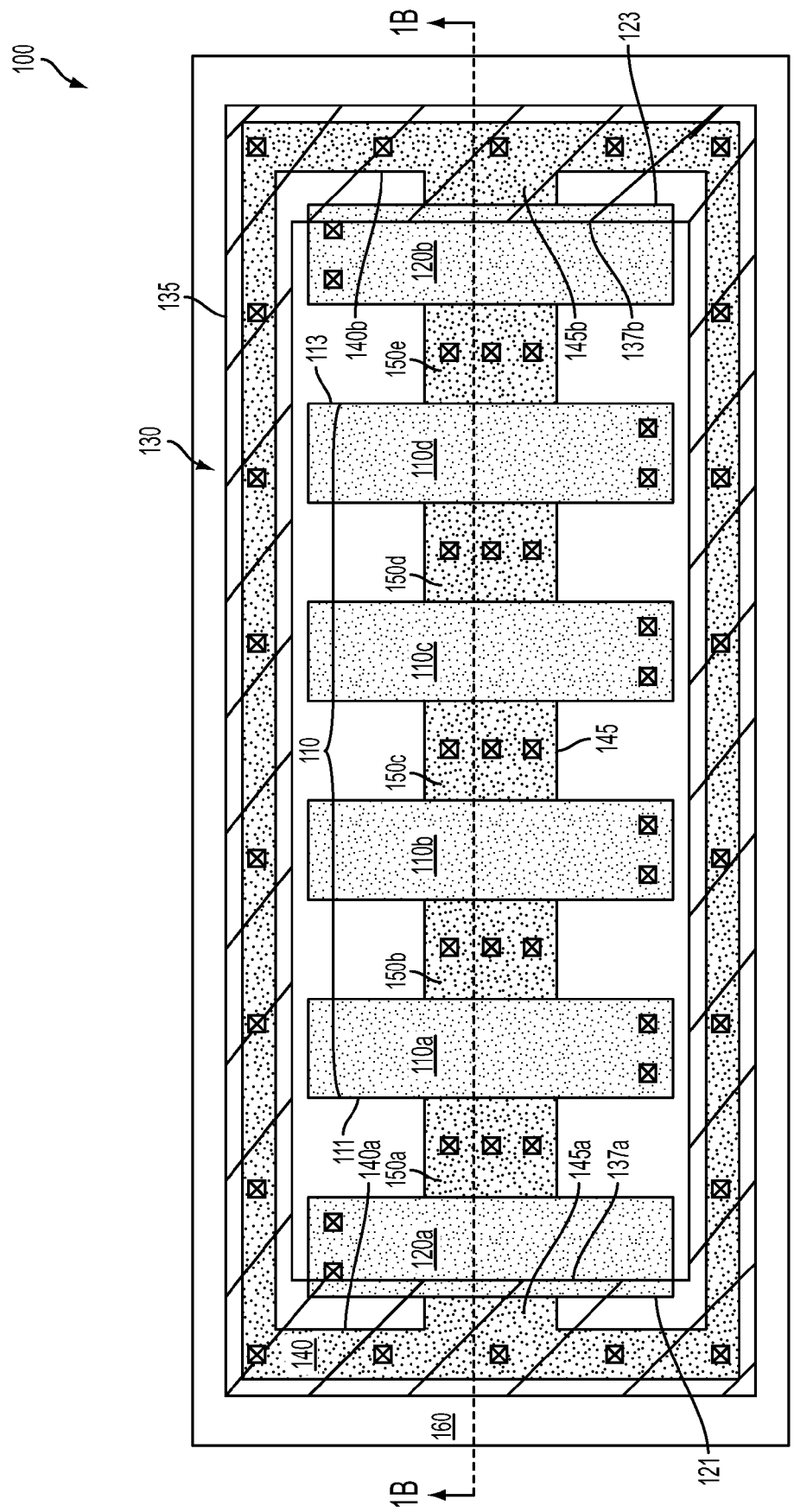
FIG. 1A is a schematic drawing illustrating an exemplary integrated circuit including at least one gate electrode disposed between dummy gate electrodes.

For analog circuits, symmetric layout designs have been implemented due to analog circuits' high precision and high-performance requirements. Additionally, matching dummy device pairs are used in the symmetric layout designs to reduce layout dependent effects, e.g., OD (oxide definition) spacing effect, LOD (length of OD region), source/drain liner stress effect, etc.

Generally, the matching dummy device pairs are electrically coupled with a common power voltage $V_{DD}$ or $V_{SS}$. In the case of P-type dummy devices, P-type source/drain (S/D) regions of the dummy device pairs are spaced and electrically isolated from an N-type guard ring by a shallow trench isolation (STI) structure. Further, the P-type S/D regions of the dummy device pairs each has a plurality of pick-up contacts for electrically coupling with the common power voltage $V_{DD}$. It is found that the area for accommodating the pick-up contacts and the STI structure between the N-type guard ring and the P-type S/D regions of the dummy device pairs have increased the area of the analog circuit.

It is understood that the following disclosure provides many different embodiments, or examples, for implementing different features of the disclosure. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "below," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features.

FIG. 1A is a schematic drawing illustrating an exemplary integrated circuit including at least one gate electrode disposed between dummy gate electrodes. In FIG. 1A, an integrated circuit 100 can include at least one gate electrode 110 of at least one active transistor. In some embodiments, the gate electrode 110 can include gate electrodes 110a-110d as shown in FIG. 1A. Though four gate electrodes 110a-110d are shown in FIG. 1A, the scope of this application is not limited thereto. In some embodiments, a single gate electrode or different number of the gate electrodes can be used.

In FIG. 1A, at least one dummy gate electrode, e.g., dummy gate electrodes 120a and 120b, can be disposed adjacent to side edges 111 and 113 of the at least one gate electrode 110, respectively. The side edge 111 is opposite to the side edge 113. Though only showing a single dummy gate electrode is disposed adjacent to each side edge of the at least one gate electrode 110 in FIG. 1A, the number of dummy gate electrodes can be modified. For example, two or more dummy gate electrodes can be disposed adjacent to each side edge of the at least one gate electrode 110.

In FIG. 1A, at least one guard ring, e.g., guard ring 130, can be disposed around the gate electrodes 110a-110d and the dummy gate electrodes 120a-120b. The guard ring 130 can include an ion implantation layer 135. In some embodiments, the ion implantation layer 135 means a reticle layer used in a process for forming the integrated circuit 100. The reticle layer can be used to form a patterned mask layer exposing a portion of a substrate in which ion dopants are implanted.

In some embodiments, the ion implantation layer 135 can substantially touch the dummy gate electrode 120a and/or the dummy gate electrode 120b. In some embodiments, the term "substantially touch" here means that the ion implantation layer 135 and at least one of the dummy gate electrodes 120a-120b can be at least partially overlapped. In other embodiments, the term "substantially touch" here means that the edges 137a and 137b of the ion implantation layer 135 can align with the edges 121 and 123 of the dummy gate electrodes 120a and 120b, respectively. In still other embodiments, the term "substantially touch" means that the ion implantation layer 135 can be spaced from the edge 121 or 123 of the dummy gate electrode 120a or 120b, respectively, due to, for example, a photolithographic misalignment.

In some embodiments, the integrated circuit 100 can be an analog circuit, a mixed-signal circuit, a static random access memory (SRAM) circuit, an embedded SRAM circuit, a dynamic random access memory (DRAM) circuit, an embedded DRAM circuit, a non-volatile memory circuit, e.g., FLASH, EPROM, E$^2$PROME, a field-programmable gate circuit, or any combinations thereof. In some embodiments, the at least one active transistor (not labeled) including the gate electrodes 110a-110d can be employed in an operational amplifier including a differential input pair, a bias circuit, and/or a current minor; a digital-to-analog converter (DAC) including a constant current source, an amplifier using an external resistor to adjust a full range current, and/or a bias circuit; an analog-to-digital converter (ADC) including a comparator, an amplifier, a sample/hold switch, a switching capacitor, and/or a reference voltage resistor ladder; a phase-locked loop (PLL) including a voltage-controlled oscillator (VCO) and/or a charge pump; a bandgap including a bipolar junction transistor (BJT), a current mirror, a bias circuit, a differential amplifier, and/or a ratioed resistor; a low-noise amplifier; a mixer; a sense amplifier in memories; a matching pair; or any combinations thereof.

Referring to FIG. 1A, the integrated circuit 100 can include at least one diffusion ring, e.g., a diffusion ring 140. In some embodiments, the ion implantation layer 135 can substantially cover the diffusion ring 140. The integrated circuit 100 can also include a diffusion area 145. The diffusion area 145 can extend from an edge 140a to another edge 140b of the diffusion ring 140. The diffusion area 145 can be substantially orthogonal to the gate electrodes 110a-110d.

In some embodiments, diffusion portions 145a and 145b of the diffusion area 145 can be disposed between the diffusion ring 140 and the dummy gate electrode 120a and between the diffusion ring 140 and the dummy gate electrode 120b, respectively. The ion implantation layer 135 can substantially cover the diffusion portions 145a and 145b of the diffusion area 145. In some embodiments, at least one of the diffusion portions 145a and 145b does not include any contact plug.

Referring to FIG. 1A, a doped region can be disposed between two adjacent gate electrodes. For example, a doped region 150a can be disposed between the dummy gate electrode 120a and the gate electrode 110a. Doped regions 150b-150d can be disposed between the gate electrodes 110a and 110b, between the gate electrodes 110b and 110c, and between the gate electrodes 110c and 110d, respectively. A doped region 150e can be disposed between the dummy gate electrode 120b and the gate electrode 110d. The doped regions 150a-150e can have the same dopant type and dopant concentration. The ion implantation layer 135 can have a dopant type that is opposite to the dopant type of the doped regions 150a-150e. For example, the doped regions 150a-150e can have P-type dopants and the ion implantation layer 135 can have N-type dopants. In some embodiments, the ion implantation layer 135 can have a dopant concentration that is different from the dopant concentration of each of the doped regions 150a-150e.

Referring again to FIG. 1A, at least one isolation structure, e.g., an isolation structure 160, can be disposed around the guard ring 130. In some embodiments, the isolation structure 160 can include a shallow trench isolation (STI) structure and/or a local oxidation of silicon (LOCOS) structure. The isolation structure 160 is configured to electrically isolate the active transistors within the guard ring 130 from adjacent transistors, devices, and/or circuits.

As noted, the diffusion area 145 continuously extends from the edge 140a to the edge 140b of the diffusion ring 140. The diffusion portions 145a-145b can be doped by the ion implantation layer 135 so as to serve as the source/drain (S/D) regions of the dummy device pairs. The diffusion portions 145a-145b abut the diffusion ring 140. The diffusion portions 145a-145b and the diffusion ring 140 can be substantially covered by the ion implantation layer 135. The S/D regions of the dummy device pairs and the guard ring 130 can be electrically coupled with a common power voltage, $V_{DD}$ or $V_{SS}$. The S/D regions of the dummy device pairs are not floating. No device that involves the S/D regions of the dummy device pairs is floating.

It is noted that the diffusion portions 145a-145b abut the diffusion ring 140. No isolation structure (e.g., STI or LOCOS) is disposed between the diffusion portions 145a-145b and the diffusion ring 140. The area of the integrated circuit 100 can thus be reduced. In some embodiments, no contact plug is disposed on at least one of the diffusion portions 145a-145b. The area of the integrated circuit 100 can, therefore, be further reduced. In some embodiments, the area of the integrated circuit without any contact plugs on the diffusion portions 145a-145b and without any isolation structure between the diffusion portions 145a-145b and the diffusion ring 140 can be reduced by about 15% or more. In other embodiments, the reduction of the area of the integrated circuit can be between about 15% and about 20%.

Figure 1B:
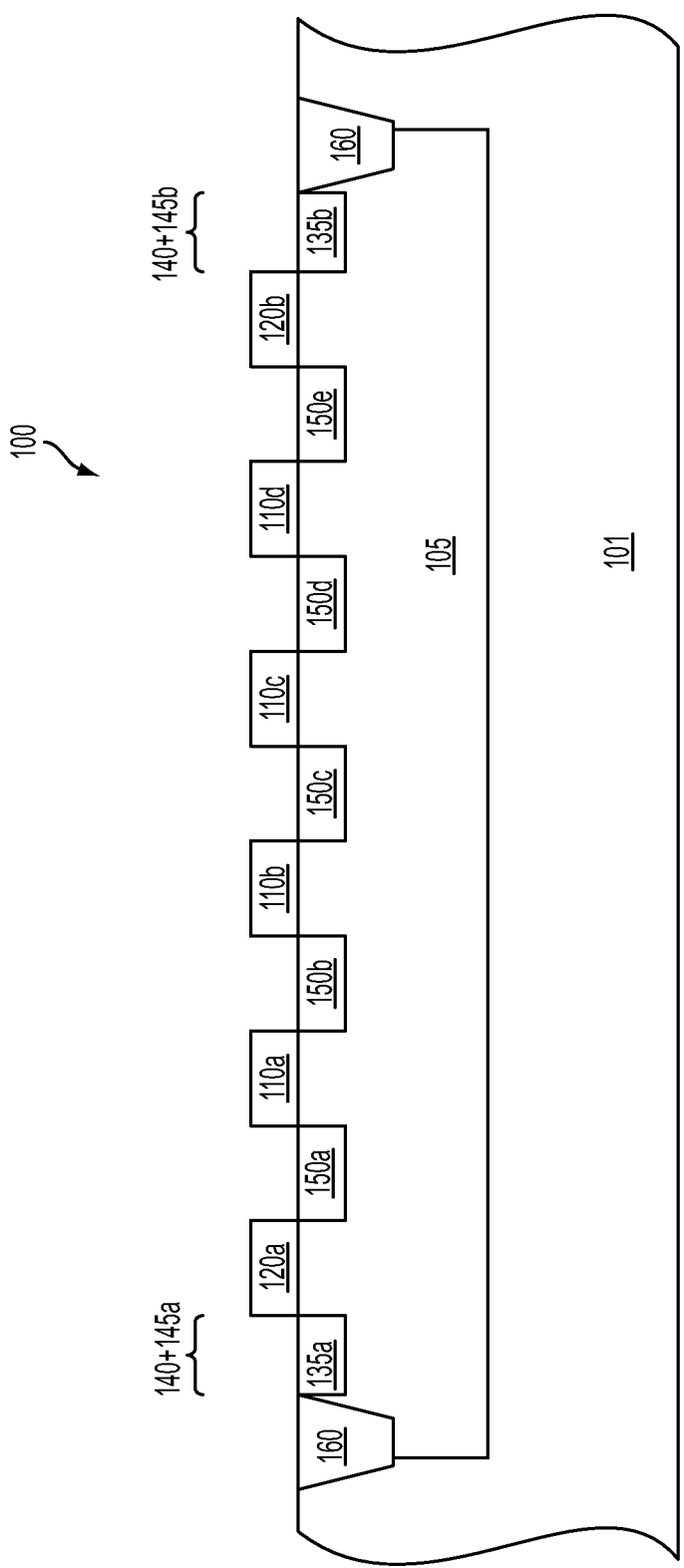
FIG. 1B is a schematic cross-sectional view of the exemplary integrated circuit taken along a section line 1B-1B of FIG. 1A.

FIG. 1B is a schematic cross-sectional view of the exemplary integrated circuit 100 taken along a section line 1B-1B of FIG. 1A. In FIG. 1B, the gate electrodes 110a-110d and the dummy gate electrodes 120a-120b can be disposed over a substrate 101. Doped regions 135a-135b are the diffusion portion 145a plus the diffusion ring 140 and the diffusion portion 145b plus the diffusion ring 140, respectively, which are doped by the implantation process of the ion implantation layer 135. The doped regions 135a and 150a can each be disposed adjacent to the respective side walls of the dummy gate electrode 120a. The doped regions 135b and 150e can each be disposed adjacent to the respective side walls of the dummy gate electrode 120b. The doped regions 135a-135b and 150a-150e, and the isolation structure 160 can be formed within the substrate 101.

In some embodiments, the substrate 101 may include an elementary semiconductor material, a compound semiconductor material, an alloy semiconductor material, or any other suitable material or combinations thereof. The elementary semiconductor material can include silicon or germanium in crystal, polycrystalline, or an amorphous structure. The compound semiconductor material can include silicon carbide, gallium arsenide, gallium phosphide, indium phosphide, indium arsenide, and indium antimonide. The alloy semiconductor material can include SiGe, GaAsP, AlInAs, AlGaAs, GaInAs, GaInP, and GaInAsP. In one embodiment, the alloy semiconductor substrate may have a gradient SiGe feature in which the Si and Ge composition change from one ratio at one location to another ratio at another location. In another embodiment, the alloy SiGe is formed over a silicon substrate. In another embodiment, a SiGe substrate is strained. Furthermore, the semiconductor substrate may be a semiconductor on insulator, such as a silicon on insulator (SOI), or a thin film transistor (TFT). In some examples, the semiconductor substrate may include a doped epitaxial layer or a buried layer. In other examples, the compound semiconductor substrate may have a multilayer structure, or the substrate may include a multilayer compound semiconductor structure.

Referring to FIG. 1B, a well region 105 can be optionally formed within the substrate 101, extending from one side to another side of the isolation structure 160. The well region 105 can be formed around the doped regions 135a-135b and 150a-150e. In some embodiment, the well region 105 can have the same dopant type as the ion implantation layer 135 and/or the doped regions 135a-135b. In other embodiments, the dopant concentration of the ion implantation layer 135 or the doped regions 135a-135b is higher than the dopant concentration of the well region 105.

Referring to FIGS. 1A-1B, contact plugs (not labeled and shown in FIG. 1A) are disposed on the gate electrodes 110a-110d, the dummy gate electrodes 120a-120b, the diffusion ring 140, and the doped regions 150a-150e for interconnection. In some embodiments, the doped regions 135a, 150a and the dummy gate electrode 120a can be electrically coupled with a common power voltage, e.g., a power voltage $V_{DD}$ or $V_{SS}$. In other embodiments, the doped regions 135b, 150e and the dummy gate electrode 120b can be electrically coupled with a common power voltage, e.g., a power voltage $V_{DD}$ or $V_{SS}$. The common dummy gate electrodes and doped regions can serve as matching dummy device pairs.

Figure 1C:
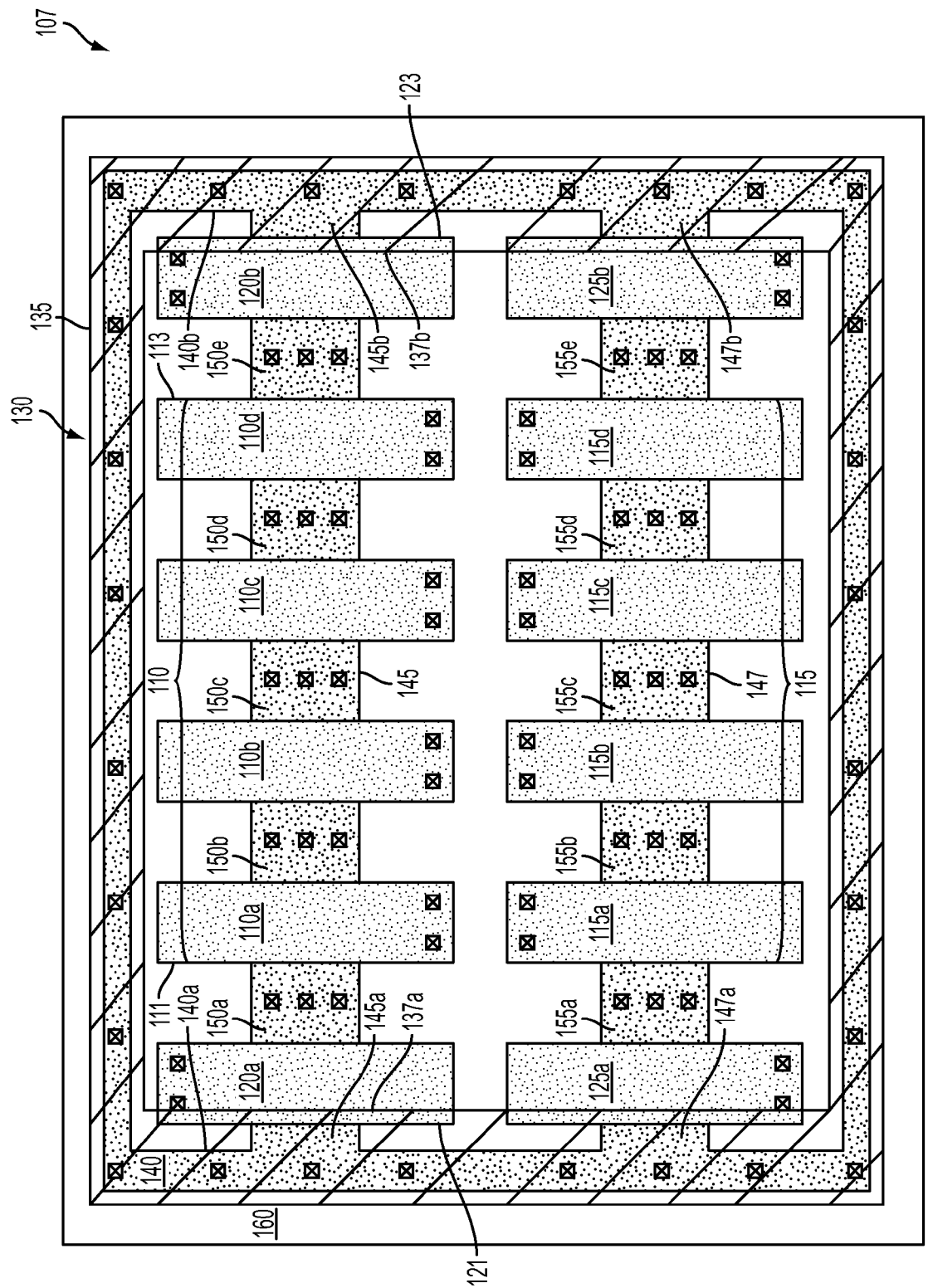
FIG. 1C is a schematic top view illustrating a second exemplary integrated circuit.

FIG. 1C is a schematic top view illustrating a second exemplary integrated circuit. In FIG. 1C, an integrated circuit 107 can include at least one gate electrode 115, e.g., gate electrodes 115a-115d. Dummy gate electrodes 125a-125b can each be disposed adjacent to the respective side edge of the at least one gate electrode 115. The at least one gate electrode 115a can be disposed orthogonal to a diffusion area 147 that extends from one edge to another edge of the diffusion ring 140. Diffusion portions 147a-147b can be disposed between the dummy gate electrode 125a and the diffusion ring 140 and between the dummy gate electrode 125b and the diffusion ring 140, respectively. Doped regions 155a-155e can each be disposed adjacent to gate electrodes of the dummy gate electrodes 125a-125b, and the gate electrodes 115a-115d.

In some embodiments, the gate electrodes 110a-110d can belong to a single active transistor or several active transistors. For example, the gate electrodes 110a-110b are electrically coupled to each other and belong to an active transistor, and the gate electrodes 110c-110d are electrically coupled to each other and belong to another active transistor. The gate electrodes 110a-110b can be electrically coupled with gate electrodes 115c-115d (shown in FIG. 1C), which belong to the active transistor that includes the gate electrodes 110a-110b. The gate electrodes 110c-110d can be electrically coupled with gate electrodes 115a-115b (shown in FIG. 1C), which belong to the active transistor that includes the gate electrodes 110c-110d. By electrically cross coupling the gate electrodes 110a-110b and 110c-110d with the gate electrodes 115c-115d and 115a-115b, respectively, electrical characteristic variations, e.g., transistor currents, transistor threshold voltages, etc., due to photolithographic misalignments or random dopant fluctuations of processes for forming the active transistors can be reduced.

Figure 2:
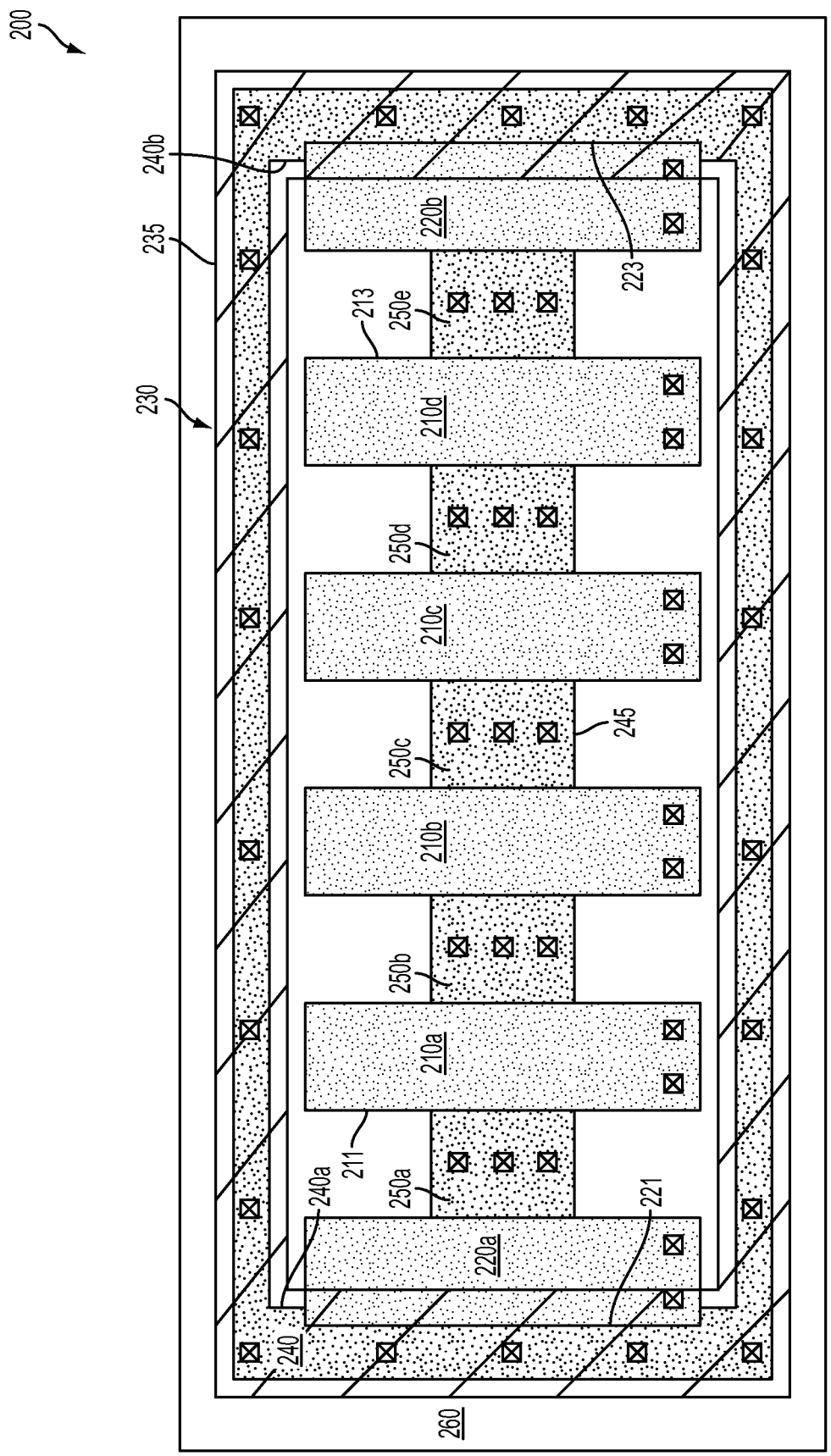
FIG. 2 is a schematic drawing illustrating a third exemplary integrated circuit.

FIG. 2 is a schematic drawing illustrating a third exemplary integrated circuit. Items of FIG. 2 that are the same items in FIG. 1 are indicated by the same reference numerals, increased by 100. In some embodiments, a diffusion ring 240 can substantially touch at least one of dummy gate electrode 220a-220b. For example as shown in FIG. 2, edges 240a and 240b of the diffusion ring 240 can substantially touch the dummy gate electrodes 220a and 220b, respectively.

In some embodiments, the term "substantially touch" here means that the diffusion ring 240 and at least one of the dummy gate electrodes 220a-220b can be at least partially overlapped. In other embodiments, the term "substantially touch" here means that the edges 240a-240b of the diffusion ring 240 can align with the edges 221 and 223 of the dummy gate electrodes 220a and 220b, respectively. In still other embodiments, the term "substantially touch" means that the diffusion ring 240 can be spaced from the edge 221 or 223 of the dummy gate electrode 220a or 220b, respectively, due to, for example, a photolithographic misalignment.

As noted, the diffusion ring 240 can substantially touch at least one of the dummy gate electrodes 220a-220b. The diffusion portions 145a and/or 145b (shown in FIG. 1A) can be optional. In some embodiments, the area of the integrated circuit 200 without the diffusion portions 145a and/or 145b can be further reduced.

Figure 3A:
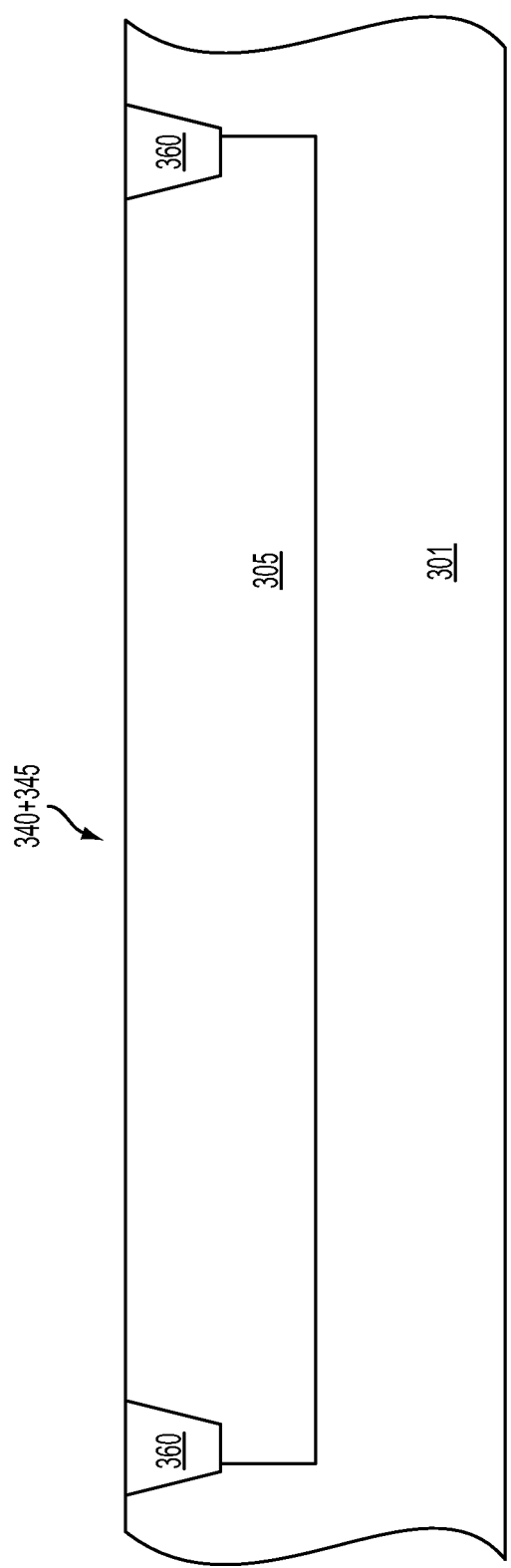
FIGS. 3A-3D are schematic cross-sectional views illustrating an exemplary method of forming an integrated circuit.

FIGS. 3A-3D are schematic cross-sectional views illustrating an exemplary method of forming an integrated circuit. Items of FIGS. 3A-3D that are the same items in FIGS. 1A-1B are indicated by the same reference numerals, increased by 200. In FIG. 3A, an isolation structure 360 can be formed within a substrate 301. By forming the isolation structure 360, a diffusion ring 340 and a diffusion area 345 can be defined within the area surrounded by the isolation structure 360. In some embodiments, the diffusion ring 340 and the diffusion area 345 may have a top view arranged in the manner similar to the diffusion ring 140 and the diffusion area 145, respectively, as described above in conjunction with FIG. 1A. In some embodiments, the isolation structure 360 can be formed by an STI process, a LOCOS process, one or more process steps for forming an isolation structure, or any combinations thereof.

In some embodiments, a well region 305 can be optionally formed within the substrate 301. The well region 305 can be formed, for example, by forming a patterned photoresist mask layer (not shown) over the substrate. The patterned photoresist mask layer can expose an area in which the well region 305 is to be formed. An ion implantation process (not shown) can be performed to implant ion dopants in the area so as to form the well region 305. The patterned photoresist mask layer is then removed. In some embodiments, the well region 305 may be subjected to a thermal process and/or a rapid thermal process (RTP) to activate the dopants in the well region 305.

Figure 3B:
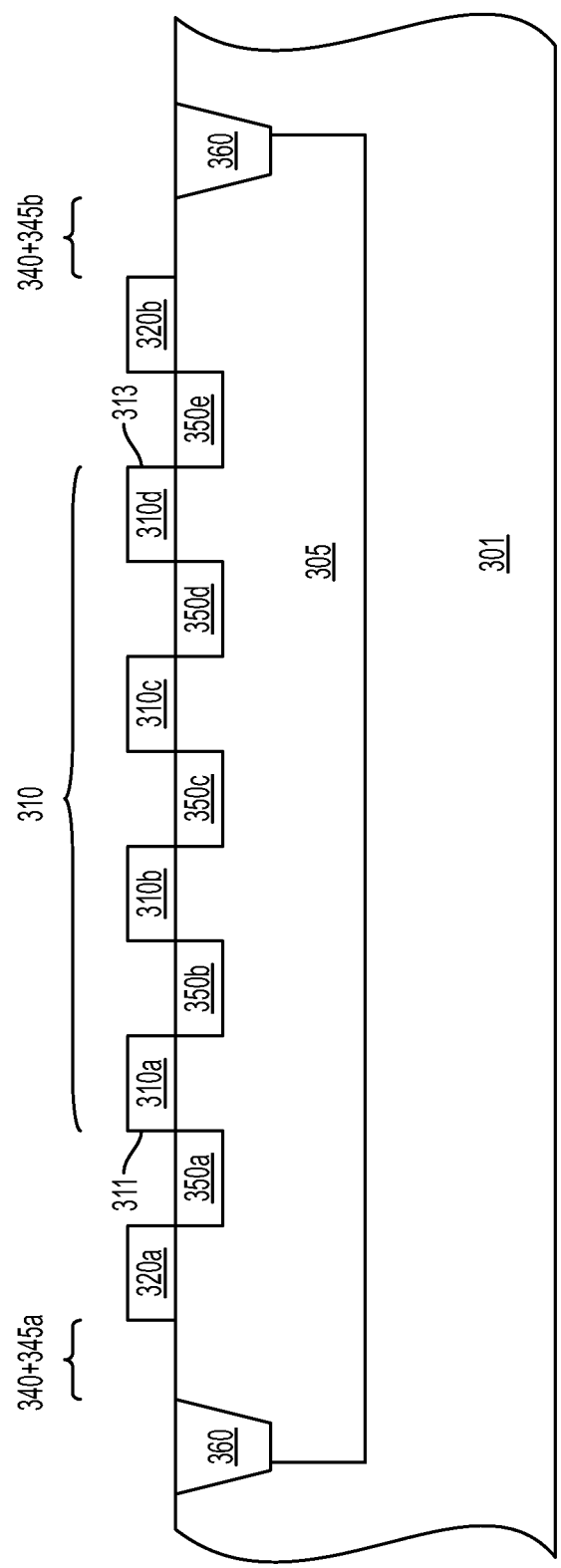

Referring to FIG. 3B, at least one gate electrode 310 of at least one active transistor and at least one dummy gate electrode, e.g., dummy gate electrodes 320a-320b, can be formed over the substrate 301. The at least one gate electrode 310 can include, for example, gate electrodes 310a-310d. The dummy gate electrodes 320a and 320b are adjacent to side edges 311 and 313 of the at least one gate electrode 310, respectively.

In some embodiments, the gate electrodes 310a-310d and/or the dummy gate electrodes 320a-320b can each include one or more materials including polysilicon, aluminum, copper, Ti, TiN, TaN, Ta, TaC, TaSiN, W, WN, MoN, MoON, $RuO_2$, and/or other suitable materials. The gate electrodes 310a-310d and the dummy gate electrodes 320a-320b may each include one or more layers formed by physical vapor deposition (PVD), chemical vapor deposition (CVD), atomic layer deposition (ALD), plating, and/or other suitable processes. The deposition layer can be defined by, e.g., photolithographic process and/or etch process for forming the gate electrodes 310a-310d and the dummy gate electrodes 320a-320b.

In other embodiments, the gate electrodes 310a-310d and/or the dummy gate electrodes 320a-320b can each include a work function metal layer such that it provides an N-metal work function or P-metal work function of a metal gate. P-type work function materials include compositions such as ruthenium, palladium, platinum, cobalt, nickel, and conductive metal oxides, and/or other suitable materials. N-type metal materials include compositions such as hafnium, zirconium, titanium, tantalum, aluminum, metal carbides (e.g., hafnium carbide, zirconium carbide, titanium carbide, aluminum carbide), aluminides, and/or other suitable materials.

In some embodiments, at least one gate dielectric (not shown) can be formed between the diffusion area 345 and each of the gate electrodes 310a-310d and/or the dummy gate electrodes 320a-320b. The gate dielectric can include a single layer or a multi-layer structure. In embodiments having a multi-layer structure, the gate dielectric can include an interfacial dielectric layer and a high-k dielectric layer. The interfacial dielectric layer may be formed by any suitable process and any suitable thickness. For example, the interfacial dielectric layer may include a material such as silicon oxide, silicon nitride, silicon oxynitride, other gate dielectric materials, and/or combinations thereof. The interfacial dielectric layer can be formed, in one or more embodiments, by thermal processes, CVD processes, ALD processes, epitaxial processes, and/or combinations thereof.

In some embodiments, the high-k dielectric layer can be formed over the interfacial layer. The high-k dielectric layer can include high-k dielectric materials such as $HfO_2$, HfSiO, HfSiON, HfTaO, HfSiO, HfZrO, other suitable high-k dielectric materials, and/or combinations thereof. The high-k material may further be selected from metal oxides, metal nitrides, metal silicates, transition metal-oxides, transition metal-nitrides, transition metal-silicates, oxynitrides of metals, metal aluminates, zirconium silicate, zirconium aluminate, silicon oxide, silicon nitride, silicon oxynitride, zirconium oxide, titanium oxide, aluminum oxide, hafnium dioxide-alumina alloy, other suitable materials, and/or combinations thereof. The high-k dielectric layer may be formed by any suitable process, such as ALD, CVD, PVD, Remote Plasma CVD (RPCVD), Plasma Enhanced CVD (PECVD), Metalorganic CVD (MOCVD), sputtering, plating, other suitable processes, and/or combinations thereof.

Referring again to FIG. 3B, in some embodiments, doped regions 350a-350e can each be formed adjacent to the corresponding sidewalls of the gate electrodes 310a-310d. For example, at least one ion implantation process (not shown) is performed for implanting ions in the diffusion area 345 that is not covered by the gate electrodes 310a-310d and the dummy gate electrodes 320a-320b. The doped regions 350a-350e can be N-type doped regions or P-type doped regions. The N-type doped regions can have dopants such as Arsenic (As), Phosphorus (P), other group V elements, or any combinations thereof. The P-type doped regions can have dopants such as Boron (B) and/or other group III elements. In some embodiments, a thermal process and/or a rapid thermal process (RTP) can be performed after the ion implantation processes.

In some embodiments, the diffusion ring 340 and the diffusion portions 345a and 345b may be subjected to the same ion implantation process that is performed to form the doped region 350a-350e. The doped regions (not shown) within the diffusion ring 340 and the diffusion portions 345a and 345b can be compensated by another ion implantation process 370 described below in FIG. 3C.

Figure 3C:
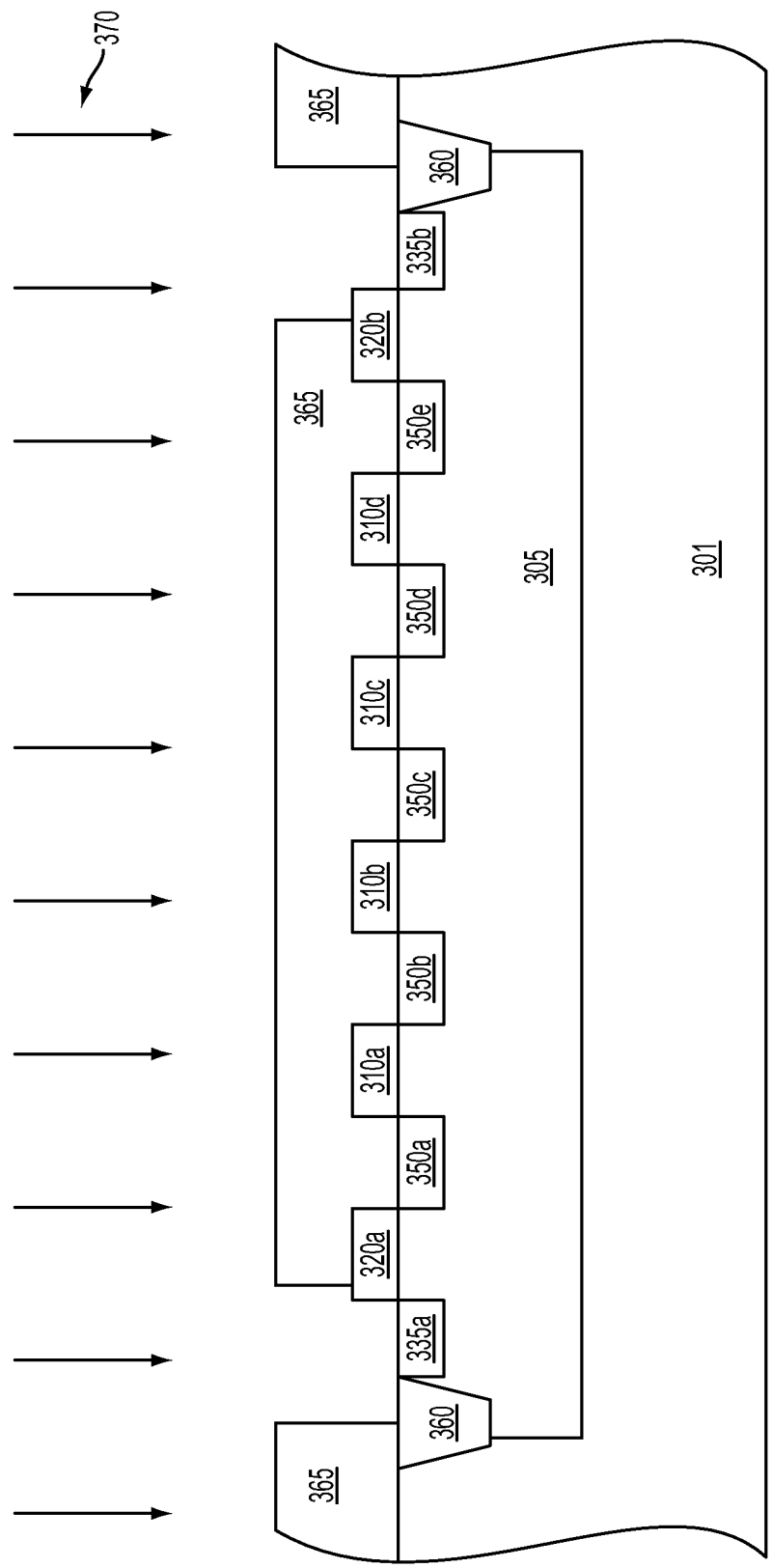

Referring to FIG. 3C, a patterned mask layer 365 can be formed over the substrate 301. The patterned mask layer 365 can include, for example, a photoresist mark layer, a dielectric mask layer, or any combinations thereof. The patterned mask layer 365 can at least partially expose at least one of the dummy gate electrodes 320a and 320b. In some embodiments, the patterned mask layer 365 can expose the diffusion ring 340 and the diffusion portions 345a-345b. In other embodiments, a patterned layer on a reticle that is used to define the patterned mask layer 365 can be referred to as the ion implantation layer 135 described above in conjunction with FIG. 1A. By using the patterned mask layer 365, the ion implantation process 370 is performed to form doped regions 335a and 335b. In some embodiments, the doped regions 335a-335b and/or 350a-350e can be subjected to a thermal process and/or a rapid thermal process (RTP) to activate the dopants in the doped regions.

Figure 3D:
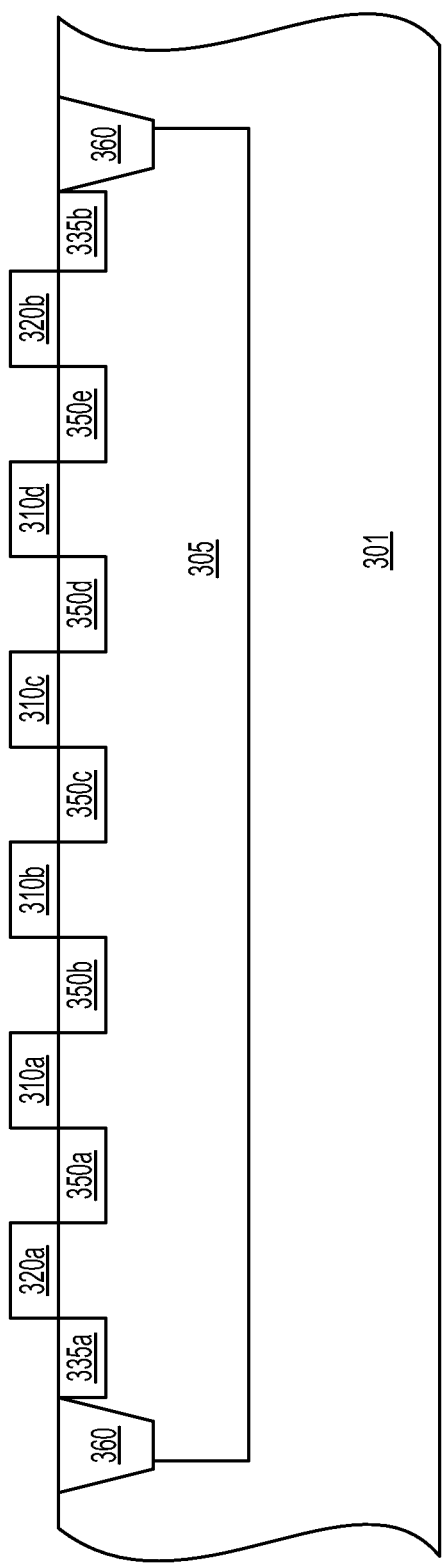

Referring to FIG. 3D, the patterned mask layer 365 (shown in FIG. 3C) can be removed by a removing process, e.g., a dry removing process, a wet removing process, or any combinations thereof.

In some embodiments, dielectric materials, via plugs, metallic regions, and/or metallic lines (not shown) can be formed over the gate electrodes 310a-310d for interconnection. In other embodiments, the doped regions 335a, 350a and the dummy gate electrode 320a can be electrically coupled with a common power voltage, e.g., a power voltage $V_{DD}$ or $V_{SS}$. In still other embodiments, the doped regions 335b, 350e and the dummy gate electrode 320b can be electrically coupled with a common power voltage, e.g., a power voltage $V_{DD}$ or $V_{SS}$.

The dielectric layers may include materials such as silicon oxide, silicon nitride, silicon oxynitride, low-k dielectric material, ultra low-k dielectric material, or any combinations thereof. The via plugs, metallic regions, and/or metallic lines can include materials such as tungsten, aluminum, copper, titanium, tantalum, titanium nitride, tantalum nitride, nickel silicide, cobalt silicide, other proper conductive materials, and/or combinations thereof. The via plugs, metallic regions, and/or metallic lines can be formed by any suitable processes, such as deposition, photolithography, and etching processes, and/or combinations thereof.

It is noted that the processes described above in conjunction with FIGS. 3A-3D are merely exemplary. In some embodiments, the diffusion portions 345a and/or 345b can be optional. By changing the layout, the processes described above in conjunction with FIGS. 3A-3D can be modified to form the integrated circuit 200 described above in conjunction with FIG. 2. In other embodiments, the processes described above in conjunction with FIGS. 3A-3D can be modified to form the integrated circuit 107 described above in conjunction with FIG. 1C. The scope of this application is not limited thereto.

FIG. 4 is a schematic drawing illustrating a system including an exemplary integrated circuit disposed over a substrate board. In FIG. 4, a system 400 can include an integrated circuit 402 disposed over a substrate board 401. The substrate board 401 can include, in some embodiments, a printed circuit board (PCB), a printed wiring board and/or other carrier that is capable of carrying an integrated circuit. The integrated circuit 402 can be similar to the integrated circuit 100, 107, or 200 described above in conjunction with FIGS. 1A, 1C, and 2, respectively. The integrated circuit 402 can be electrically coupled with the substrate board 401. In some embodiments, the integrated circuit 402 can be electrically coupled with the substrate board 401 through bumps 405. In other embodiments, the integrated circuit 402 can be electrically coupled with the substrate board 401 through wire bonding (not shown). The system 400, in some embodiments, can be part of an electronic system such as computers, wireless communication devices, computer-related peripherals, entertainment devices, or the like.

In some embodiments, the system 400 including the integrated circuit 402 can provide an entire system in one IC, so-called system-on-chip (SOC) or system-on-integrated-circuit (SOIC) devices. These SOC/SOIC devices may provide, for example, all of the circuitry needed to implement a cell phone, personal data assistant (PDA), digital VCR, digital camcorder, digital camera, MP3 player, or the like in a single integrated circuit.

One aspect of this description relates to an integrated circuit comprising a gate electrode of at least one active transistor. The integrated circuit also comprises a first dummy gate electrode on a first side of the gate electrode. The integrated circuit further comprises a second dummy gate electrode on a second side of the gate electrode, the second side being opposite the first side. The integrated circuit additionally comprises a diffusion ring surrounding the gate electrode, the first dummy gate electrode, and the second dummy gate electrode. The integrated circuit also comprises a diffusion area extending from a first edge of the diffusion ring to a second edge of the diffusion ring.

Another aspect of this description relates to an integrated circuit comprising a gate electrode of at least one active transistor over a substrate. The integrated circuit also comprises a dummy gate electrode. The integrated circuit further comprises a diffusion ring surrounding the gate electrode and the dummy gate electrode. The integrated circuit additionally comprises a diffusion area extending from a first edge of the diffusion ring to a second edge of the diffusion ring. The diffusion area is substantially orthogonal to the gate electrode.

A further aspect of this description relates to an integrated circuit comprising a gate electrode of at least one active transistor. The integrated circuit also comprises a first dummy gate electrode. The integrated circuit further comprises a second dummy gate electrode. The integrated circuit additionally comprises a diffusion ring surrounding the gate electrode, the first dummy gate electrode, and the second dummy gate electrode. The integrated circuit also comprises a diffusion area extending from a first edge of the diffusion ring to a second edge of the diffusion ring. The first edge of the diffusion ring substantially touches the first dummy gate electrode.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit comprising:
   a gate electrode of an active transistor;
   a first dummy gate electrode on a first side of the gate electrode;
   a second dummy gate electrode on a second side of the gate electrode, the second side being opposite the first side; and
   a diffusion ring surrounding the gate electrode, the first dummy gate electrode, and the second dummy gate electrode; and
   a diffusion area extending from a first edge of the diffusion ring to a second edge of the diffusion ring.

2. The integrated circuit of claim 1, wherein the first dummy gate electrode is adjacent to the first edge of the diffusion ring.

3. The integrated circuit of claim 1, further comprising:
   an ion implantation layer surrounding the gate electrode, the first dummy gate electrode, and the second dummy gate electrode.

4. The integrated circuit of claim 3, wherein the ion implantation layer substantially touches at least one of the first dummy gate electrode or the second dummy gate electrode.

5. The integrated circuit of claim 3, further comprising:
   a doped region between the gate electrode and the first dummy gate electrode, wherein the doped region has a dopant type that is opposite to a dopant type of the ion implantation layer.

6. The integrated circuit of claim 1, wherein the diffusion area comprises a diffusion portion, and the first edge of the diffusion ring substantially touches the diffusion portion.

7. The integrated circuit of claim 1, further comprising:
   an isolation structure surrounding the diffusion ring.

8. An integrated circuit comprising:
   a gate electrode of an active transistor over a substrate;
   a dummy gate electrode;
   a diffusion ring surrounding the gate electrode and the dummy gate electrode; and
   a diffusion area extending from a first edge of the diffusion ring to a second edge of the diffusion ring,
   wherein the diffusion area is substantially orthogonal to the gate electrode.

9. The integrated circuit of claim 8, further comprising:
   an isolation structure surrounding the diffusion ring.

10. The integrated circuit of claim 9, wherein the isolation structure is a shallow trench isolation feature.

11. The integrated circuit of claim 8, further comprising:
    a reticle layer surrounding the gate electrode, the first dummy gate electrode, and the second dummy gate electrode.

12. The integrated circuit of claim 11, wherein the reticle layer substantially touches at least one of the first dummy gate electrode or the second dummy gate electrode.

13. The integrated circuit of claim 11, wherein the reticle layer substantially covers the diffusion ring.

14. The integrated circuit of claim 11, further comprising:
    a doped region between the gate electrode and the dummy gate electrode, wherein the doped region has a dopant type that is opposite to a dopant type of the reticle layer.

15. An integrated circuit comprising:
a gate electrode of an active transistor;
a first dummy gate electrode;
a second dummy gate electrode;
a diffusion ring surrounding the gate electrode, the first dummy gate electrode, and the second dummy gate electrode; and
a diffusion area extending from a first edge of the diffusion ring to a second edge of the diffusion ring,
wherein the first edge of the diffusion ring substantially touches the first dummy gate electrode.

16. The integrated circuit of claim 15, further comprising:
a patterned mask layer surrounding the gate electrode, the first dummy gate electrode, and the second dummy gate electrode.

17. The integrated circuit of claim 16, wherein the patterned mask layer covers the gate electrode, partially covers the first dummy gate electrode, and partially covers the second dummy gate electrode.

18. The integrated circuit of claim 17, further comprising:
an isolation structure surrounding the diffusion ring.

19. The integrated circuit of claim 18, wherein the diffusion ring comprises a doped region between the first dummy gate electrode and the isolation structure.

20. The integrated circuit of claim 19, wherein the patterned mask layer is arranged having an opening, exposing the doped region.

* * * * *